United States Patent [19]
Tachibana et al.

[11] Patent Number: 5,479,875
[45] Date of Patent: Jan. 2, 1996

[54] FORMATION OF HIGHLY ORIENTED DIAMOND FILM

[75] Inventors: Takeshi Tachibana; Kimitsugu Saito; Kazushi Hayashi; Kozo Nishimura; Rie Nakamura, all of Kobe, Japan

[73] Assignee: Kabushiki Kaisha Kobe Seiko Sho, Kobe, Japan

[21] Appl. No.: 278,315

[22] Filed: Jul. 21, 1994

[30] Foreign Application Priority Data

Sep. 17, 1993 [JP] Japan .................... 5-231595

[51] Int. Cl.⁶ .................................... C30B 23/08
[52] U.S. Cl. .................... 117/103; 117/929; 427/517; 423/446
[58] Field of Search ................... 117/103, 929; 427/577; 423/446

[56] References Cited

U.S. PATENT DOCUMENTS

| | | | |
|---|---|---|---|
| 4,830,702 | 5/1989 | Singh et al. | 117/929 |
| 5,180,571 | 1/1993 | Hosaya et al. | 117/929 |
| 5,298,286 | 3/1994 | Yang et al. | 117/929 |
| 5,314,570 | 5/1994 | Ikegaya et al. | 117/929 |

FOREIGN PATENT DOCUMENTS

| | | | |
|---|---|---|---|
| 02-107596 | 4/1990 | Japan | 117/929 |
| 02-243598 | 9/1990 | Japan | 117/929 |
| 02-263789 | 10/1990 | Japan | 117/929 |
| WO9313242 | 7/1993 | WIPO | 427/577 |

*Primary Examiner*—Robert Kunemund
*Attorney, Agent, or Firm*—Oblon, Spivak, McClelland, Maier & Neustadt

[57] ABSTRACT

A method of forming a highly oriented diamond film having a reduced thickness with a high quality at a low cost. Surface of a single crystal substrate is cleaned, and is then left in a high vacuum of $10^{-6}$ Torr or less at a temperature between room temperature and 800° C. for 15 min for releasing gas molecules absorbed on the surface of the substrate. The surface of the substrate is then processed using carbon-containing plasma for forming a barrier of obstructing a carbon component within the substrate. After that, an electric field is applied across the substrate and plasma for allowing a current to flow thereacross for a specified time, to form nuclei of diamond for synthesis of a diamond film. Thus, highly oriented diamond particles or films, in which crystal orientations thereof are epitaxial to the substrate, are synthesized.

16 Claims, 1 Drawing Sheet

FORMATION OF HIGHLY ORIENTED DIAMOND FILM

BACKGROUND OF THE INVENTION

1. Field of the Invention

The present invention relates to a method of forming highly oriented diamond films by microwave plasma chemical vapor deposition. The films are used for electronic devices such as transistors, diodes and sensors, or for electronic parts such as heat sinks, surface acoustic elements, X-ray windows, optical materials and coatings.

2. Description of the Related Art

Diamond is excellent in heat resistance, and has a wide band gap. It is an electrically insulating material but becomes a semiconducting material once doped with impurities. Moreover, it has a large breakdown voltage, a large saturated drift velocity, and a small dielectric constant. Diamond, having such excellent features, is expected to be a useful for electronic parts and electronic devices for high temperature, high frequency and high electric field applications.

To make full use of the excellent characteristics of diamond for electronic devices, it is important to synthesize a high quality single crystal diamond in which impurities are controlled. However, a single crystal diamond obtained by a prior art high temperature/high pressure synthesis is limited in terms of the size. It is also impossible add/eliminate impurity by controlled amount. Besides the above-described high temperature/high pressure synthesis, diamond may be formed by vapor-phase synthesis such as microwave CVD, thermal filament, dc plasma CVD or combustion process. The vapor-phase synthesis is advantageous in control of impurities. It is capable of forming a thin film of diamond and therefore is expected to be applied to synthesize diamond for use in electronic materials. Conventionally, only polycrystalline diamond with high density crystal boundaries had been obtained on a substrate made of a material other than diamond through vapor-phase synthesis. However, in recent years, a method that a highly oriented diamond film strongly following the crystal orientation of the substrate can be synthesized in vapor-phase on a single crystal silicon substrate (S. D. Wolter, B. R. Stoner and J. T. Glass, Applied Physics Letters, Vol. 62, pp. 1215–1217 (1993); and X. Jiang and C. P. Klages, Diamond and Related Materials, Vol. 2, pp. 1112–1113 (1993)) has been proposed. In this method, a substrate is exposed to plasma for a specified period of time while a negative dc electric field is applied to the substrate before the film formation, and then the usual synthesis is performed. This method exhibits a possibility to manufacture diamond films with large areas and high qualities which are applicable for electronic devices.

However, the method disclosed in the above-described references, has the following disadvantages:

(1) In this method, polycrystalline diamond with a low degree of orientation is first formed on a silicon substrate. The degree of orientation is then gradually enhanced along with the vapor-phase synthesis time. Accordingly, to achieve the characteristics used for electronic devices, the highly oriented film requires the thickness ranging from 20 to 50 µm or more. To ensure the required film thickness, the highly oriented diamond film must be synthesized for 1 to 2 days. This time span causes disadvantages in increasing the cost. It is also difficult to obtain a thin (or the order of µm to a fraction of µm) layer of highly oriented diamond films using the prior art.

(2) The prior art highly oriented diamond film significantly improves the quality compared with the conventional polycrystalline diamond film. However, it fails to perfectly remove grain boundaries. To be suitably used as an electronic material, a diamond film having a planarized surface and with the furthermore reduced grain boundaries must be formed by vapor-phase synthesis.

(3) To strongly oriented <100> textured crystal planes, the conventional highly oriented diamond film is formed under the condition which is very different from that of the usual vapor-phase synthesis for diamond. Consequently, the highly oriented diamond film which is obtained contains high density defects at the grain boundaries and on the surface, thus exerting adverse effect on the electrical properties of the interior and the surface of the film.

SUMMARY OF THE INVENTION

An objective of the present invention is to provide a method of forming a highly oriented diamond film, capable of forming high quality film of reduced thickness at low cost.

The above objective can be achieved by provision of a method of forming a highly oriented diamond film using the following steps: cleaning the surface of a single crystal substrate, and leaving it in a high vacuum of $10^{-6}$ Torr or less at a temperature between room temperature and 800° C. for 15 in order to release gas molecules absorbed on the surface of said substrate; processing the surface of the single crystal substrate using carbon-containing plasma; applying an electric field between the substrate and the plasma for allowing a current to flow thereacross for a specified time, thereby forming nuclei of diamond for synthesizing a diamond film; and synthesizing highly oriented diamond particles or films in which crystal orientations thereof are epitaxial to the substrate.

DETAILED DESCRIPTION OF THE PREFERRED EMBODIMENTS

Figure 1:
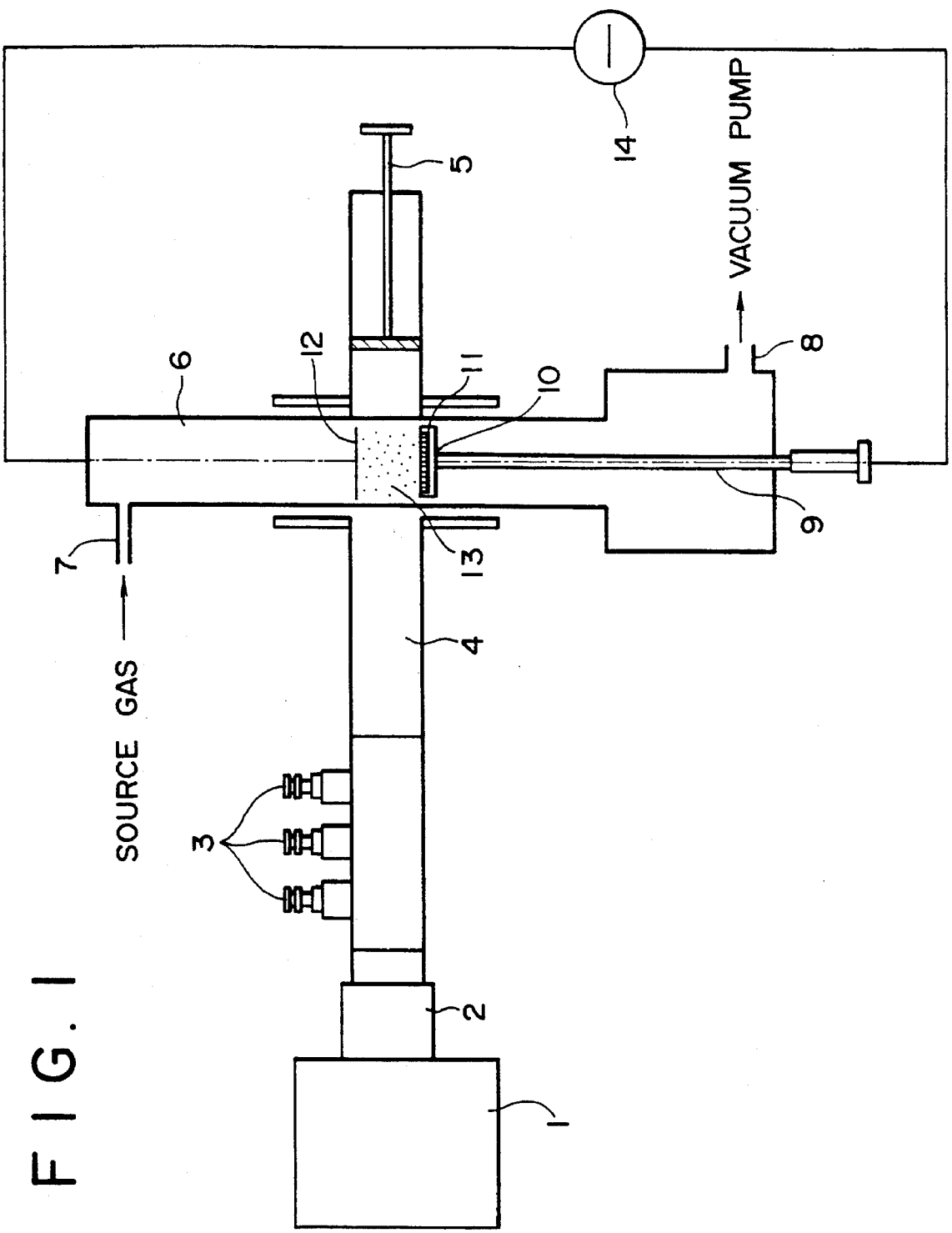
FIG. 1 is a schematic view showing a quartz-tube-reactor-type microwave plasma CVD system used for synthesis of diamond according to embodiments of the present invention.

According to the present invention, synthesis of diamond by microwave plasma CVD is made by the steps of first processing the surface of a single crystal substrate by carbon-containing plasma to form a barrier for preventing the diffusion of a carbon component within the substrate, second, applying an electric field across the substrate and plasma for allowing a current thereacross for a specified period of time, to form nuclei of diamond with a high density, and finally, synthesizing highly oriented diamond particles or films. In this method, the crystal nuclei of diamond formed by the applied electric field follows the crystallinity on the surface of the substrate. As a result, highly oriented diamond particles or films, in which crystals are epitaxial to the substrate, can be synthesized.

In general, molecules of nitrogen, oxygen and water are physically or chemically absorbed on the surface of a substrate. In particular, for a single crystal silicon substrate generally used for formation of a highly oriented diamond film, a layer of silicon dioxide generated by reaction with oxygen in the atmospheric air exists on the surface of the substrate. When the surface of the substrate on which the above molecular oxides or the oxide layers remain is carbonized, these oxides act as a barrier against epitaxy. Defects are generated in the carbide layer and the orientations of diamond particles deposited in the subsequent process are disordered.

To solve the above problem, the surface of the single crystal silicon substrate is cleaned by a diluted hydrofluoric acid, or by plasma etching using a fluorine-containing gas. The surface of the substrate is then left in a high vacuum of $10^{-6}$ Torr or less at a temperature between room temperature and 800° C. for 15 min. As a result, the molecules absorbed on the surface are released and the regular surfaces of silicon crystals are exposed. Using such a clean substrate, a silicon carbide layer is epitaxially grown on the surfaces of the silicon crystals. Therefor diamond can be deposited in the subsequent process, so that the diamond particles are highly oriented. When the substrate temperature is less than room temperature, the molecules are not released but rather absorbed. When the temperature is more than 800° C., the surface of the silicon substrate becomes uneven because of the thermal motion of silicon atoms which obstructs the epitaxial growth of the silicon carbide layer and diamond layer.

The surface of the single crystal substrate is carbonized by carbon-containing plasma in order to form a single crystal carbide layer on the single crystal substrate. During the carbonizing process, amorphous carbon and graphite are simultaneously formed. The amorphous carbon and graphite have no orientational relationship with the substrate, and exert adverse effect on the synthesis of a highly oriented diamond film. To cope with this problem, prior to the applying of an electric field, the substrate is preferably exposed to the plasma of a gas containing hydrogen, oxygen, chlorine or fluorine, or an inert gas such as helium, neon or argon for a specified period of time, to remove the remaining amorphous carbon and graphite.

During the vapor-phase synthesis of diamond, the carbon atoms are entrapped on the surface of the substrate. When the entrapped amount of carbon atoms exceeds a saturated value, the generation of nuclei of diamond is initiates. However, since the surface of the substrate is damaged by the collision with high energy ions in the plasma, numerous defects are generated on the surface, thus reducing the degree of orientation of diamond. Accordingly, it is desirable to generate nuclei of diamond as soon as possible after starting the vapor-phase synthesis of a diamond film. To solve this problem, the surface of the substrate contains carbon, preferably in an amount more than that is produced during a stable phase in the thermodynamic equilibrium. For example, in the case of a single crystal silicon substrate during the carbonization of the surface of the substrate, the surface of the substrate may contain carbon in excess of the content of Si:C=1:1. In this way, carbon atoms excessively present on the surface are diffused over the surface directly after vapor-phase synthesis of diamond, to form nuclei of diamond. This reduces a period of time required for the surface of the substrate to be exposed to the plasma, and to generate nuclei of diamond on the substrate with less plasma damage, thus improving the orientations of diamond particles or films.

In the process of applying an electric field across the substrate and plasma for forming nuclei of diamond, a lot of positively changed ions with appropriate energy are attracted to and collide with the surface of the substrate by the applied electric field. This process accelerates the diffusion of carbon on the substrate surface. However, during a process of applying an electric field, other than the epitaxial nuclei of diamond, diamond having no orientation to the substrate is also formed together with amorphous carbon and graphite. These reaction products exert adverse effect on the quality of a highly oriented diamond film. To cope with this problem, during a process of applying an electric field, a reaction gas containing hydrocarbon diluted with hydrogen, oxygen, chlorine and fluorine, or an inert gas such as helium, neon or argon is added to selectively remove amorphous carbon and graphite, which have bonding forces weaker than that of the highly oriented diamond following the crystal orientation of the substrate. It is also used to selectively remove highly oriented diamond having no orientation to the substrate. In particular, when an inert gas is added, energy exchange on the surface of the substrate is generated in a high degree, so that the degree of the orientation of diamond nuclei is enhanced.

In the prior art synthesis of a highly oriented diamond film, during a process of applying an electric field across the substrate and plasma for a specified period of time, hydrocarbon diluted with 2% hydrogen is added, and a bias voltage is applied for 5 to 9 min. However, in crystal growth, the deposition rate is desirable to be lower in order that the atoms can reach the position of the most stable atom. In this regard, it is desirable to use hydrocarbon gas with a low concentration. This makes it possible to restrict the formation of diamond on the most stable orientated plane, and hence to improve the degree of orientation in the highly oriented diamond film. On the other hand, the time required for applying the bias voltage is made longer as the concentration of hydrocarbon is lowered, and it takes 10 min or more. The upper limit of the time for applying the bias voltage is preferably in the range of 90 min or less for preventing the generation of secondary diamond particles.

In this case, when the concentration of hydrocarbon is more than 2%, the deposition rate becomes excessively larger, thus reducing the degree of orientation. On the contrary, when it is less than 0.1%, diamond does not nucleate. Accordingly, hydrocarbon is preferably diluted with hydrogen such that the concentration thereof is in the range from 0.1 to 2%. When the gas pressure is more than 30 Torr, the effect of applying an electric field is eliminated and the deposition rate is increased, thus reducing the degree of orientation. On the contrary, when it is less than 1 Torr, diamond does not grow, and the grown diamond particles are etched because of the applied electric field. Accordingly, the preferable gas pressure is in the range from 1 to 30 Torr. When the substrate temperature is more than 1100° C., diamond is converted into graphite. When it is less than 400° C., it is difficult to desorb the molecules on the substrate surface thus to obtain highly oriented diamond films. Additionally, when the voltage applied to the substrate is less than −100 V, diamond nuclei are not generated. When the voltage applied is more than −350 V, the formed nuclei of diamond are damaged.

In synthesis of diamond by the prior art microwave CVD, using a source gas of methane with a concentration of about 1%, the crystal surfaces of diamond particles mainly become (100) planes. The present inventors have experimentally found that diamond particles are orientated in only (100) planes using a source gas of methane with a high concentration added with a high concentration of oxygen. This is because the growth of diamond particles with (100) planes are accelerated by methane with a high concentration. Simultaneously, the growth of diamond particles with other planes are suppressed by the etching effect of high concentrated oxygen. Consequently, the condition that only the diamond particles with (100) planes are grown, can be realized. For this reason, the above condition of using methane added with oxygen is applied to the processes of carbonizing the surface of the substrate with carbon-containing plasma, forming nuclei of diamond by applying an electric field, and synthesizing a highly oriented diamond film. As a result, it becomes possible to grow only nuclei of diamond with (100) planes epitaxially grown on the (100) plane of the single crystal silicon substrate, and hence, obtain a film in which the crystals of diamond are substantially perfectly orientated in (100) planes.

Using a source gas of methane which is added with an inert gas such as helium, neon or argon in place of oxygen, the plasma is furthermore activated, so that the orientation of the surfaces of diamond particles vary mainly from (111) planes to (100) planes. With this condition, it also becomes possible to obtain a diamond film in which diamond particles are oriented in (100) planes on the (100) plane of the single crystal silicon substrate. By the addition of the halogen element-containing gas, the unstable nuclei not epitaxially grown on the substrate are etched by the halogen element decomposed in plasma. This results a growth of only diamond particles with (100) planes.

By the addition of boron in the vapor-phase during synthesis of a highly oriented diamond film, the planarization and the crystallinity of a film can be improved. The mobility of precursors for forming carbon atoms or diamond on the surface of a diamond film is enhanced the addition of boron in the vapor-phase. Accordingly, carbon atoms are buried in irregularities, particularly, in grain boundaries of the surface of the film. Hence, the surface of the film is planarized and the density of crystal defects is reduced.

Various kinds of single crystals may be applied as a substrate on which a highly oriented diamond film is synthesized. In particular, a single crystal silicon is preferably used, because it makes the epitaxial growth of silicon carbide on the surface and the epitaxial growth of diamond easy. The single crystal silicon has the same crystal structure as diamond and is similar to diamond in terms of the covalent bond. Accordingly, diamond grown on the single crystal silicon substrate can easily follow the characteristics of the substrate. Likewise, silicon carbide epitaxially grown on the substrate suppresses the carbon component on the surface from being diffused within the substrate, however, keeping the excessive amount of the carbon component on the surface of the substrate.

Silicides may be used as the materials in the epitaxial relation to the single crystal silicon substrate and acting as a diffusion barrier of carbon. Such silicides include nickel silicide, cobalt silicide, titanium silicide, tantalum silicide and tungsten silicide. The above effect can be obtained by the epitaxial growth of silicides such as nickel silicide on the surface of a single crystal silicon substrate.

Single crystal nickel or cobalt is useful as a substrate material. This is because the lattice constant of these material is similar to diamond. It has been difficult to obtain supersaturation of carbon on the surface of the above substrate because of the high diffusion coefficient of carbon into the substrate. However, this problem can be solved by carbonizing the surface of the substrate with carbon-containing plasma, and accurately controlling the temperature condition. Likewise, single crystal copper is also effective as a substrate material. This is because it is similar to diamond in lattice constant and is effective for the epitaxial growth. Further, it does not form a carbide and easily makes the surface in the state to contain a carbon component in an excessive amount. Accordingly, a diamond film grown on the substrate can easily follow the crystal structure of the substrate.

The material of a holder for holding a substrate in a reaction chamber exerts a large effect on the formation of a highly oriented diamond film. The substrate is disposed in the reaction chamber of a diamond deposition system, such that the side surface of the substrate is surrounded by the holder made of a material containing molybdenum, in order to increase the deposition rate of diamond. This is because molybdenum has a function to reduce chemical seeds, that is, radical seeds of obstructing the deposition of diamond. In the present invention, the holder containing molybdenum having a function of accelerating the deposition of diamond is disposed near the substrate. This is done in order to furthermore enhance the effect of increasing the deposition rate of diamond on the surface of the substrate.

The covering of the holder with diamond is effective to form a high orientated diamond film. By covering all or part of the surface of the holder with diamond, which is capable of emitting electrons with the efficiency higher than metal, the exchange of charge with plasma is effectively performed when an electric field is applied in the process of forming nuclei of diamond. As a result, nuclei of diamond is effectively generated and non-diamond carbon components can be selectively removed. The holder is covered with diamond by brazing diamond or directly depositing diamond in vapor-phase on the surface of the holder.

it is desirable that the difference surface of a substrate and the surface of a holder is in the same height. When an electric field is applied in the process of forming nuclei of diamond, the distribution of the field is deflected around the stepped portion. As a result, the generation density of nuclei on the substrate is made uneven and the orientation of a high orientated diamond film is deteriorated. Accordingly, the difference in height between the surface of the substrate and the surface of the holder is preferably in the range of 10% or less of the distance between the emission center of plasma and the surface of the holder.

In a quartz tube type microwave plasma CVD system for synthesis of a high orientated diamond film, a reaction chamber crosses at right angles to a microwave waveguide and a holder is disposed at the crossing portion. In this case, if there is a difference in height between the surface of the holder and the bottom surface of the waveguide, the propagation of microwaves is obstructed by the stepped portion, which deflects the shape of plasma. Accordingly, the difference in height is preferably in the range of 20% or less of the height of the waveguide.

For enhancement of the quality of a highly oriented diamond film, it is effective to remove a substrate after forming a highly oriented diamond film, and to remove, by plasma etching, all or part of a polycrystalline film formed at the interface between the substrate and the highly oriented diamond film. The polycrystalline diamond film formed at the interface between the substrate and the highly oriented diamond film has high density of grain boundaries and defects. Moreover, it has a large internal stress. It is revealed that the mobility of the planarized semiconducting diamond film is improved by removal of the polycrystalline diamond film. The removal of the polycrystalline diamond film is effectively performed by plasma etching using oxygen gas. Experiments show that the mobility of charge in the highly oriented diamond film that was obtained becomes several times larger as prior to the removal of the polycrystalline diamond film.

The present invention will be more clearly understood with reference to the following examples:

EXAMPLE 1

FIG. 1 is a schematic view of a quartz tube type microwave CVD system used for synthesis of diamond by applying an electric field on a substrate according to the embodiment of the present invention. As shown in FIG. 1, a holder 10 is supported by a supporting bar 9 with the surface held in the horizontal direction within a chamber 6. A substrate 11 is mounted on the holder 10. The substrate 1 is movable in the vertical direction by the vertical movement of the supporting bar 9. A microwave waveguide 4 for emitting a microwave is disposed outside the chamber 6 and in close proximity to the chamber 6 within the chamber so as to be horizontally held. A microwave power supply 1, an isolator 2 for preventing the reflected microwave generated from the microwave power supply 1 from entering the microwave power supply 1, and a tuner 3 for adjusting the reflected wave to be minimized, are provided at one-end portion of the waveguide 4. A plunger 5 for adjusting a resonance position of microwaves or adjusting the position of plasma is disposed at the other end portion of the waveguide 4. An inlet 7 for a source gas is provided at the upper end of the chamber 6, and an exhaust port 8 connected to a vacuum pump is provided at the lower end portion of the chamber 6. The chamber 6 is evacuated by way of the exhaust port 8, and a source gas is supplied within the chamber 6 by way of the inlet 7. A flat electrode 12 is disposed near a holder 10 within the chamber 6 so as to be opposed to the substrate 11 mounted on the holder 10. The holder 10 and the facing electrode 12 are connected to an external ac power supply 14. Thus, a dc voltage is applied across the substrate 11 and the electrode 12.

In the system having the above construction, a source gas is supplied in the chamber 6, and a microwave is emitted while a dc voltage is applied to the substrate 11 under a specified gas pressure. The source gas is ionized, and generates plasma 14 near the substrate 11. Diamond particles are thus formed on the substrate 11, to form a highly oriented diamond film on she substrate. Using this system, highly oriented diamond films synthesized under the following conditions of (a) to (c). A (100) single crystal silicon used for the substrate and molybdenum is used for the holder. The surface of the holder previously coated with diamond. The thickness of the substrate adjusted such that a difference in height between the surface of the substrate and the surface of the holder eliminated. In addition, the surface of the holder adjusted to be in the same level as that of the bottom surface of the microwave waveguide.

(a) Plasma Processing Before Applying Electric Field

| | |
|---|---|
| reaction gas | $CH_4/H_2$ (1 vol %) |
| flow rate of gas | 100 sccm |
| substrate temperature | 850° C. |
| gas pressure | 25 Torr |
| plasma processing time | 120 min |

-continued (b) Plasma Processing During Applying Electric Field

| | |
|---|---|
| reaction gas | $CH_4/H_2$ (0.1 to 2 vol %) |
| flow rate of gas | 100 sccm |
| substrate temperature | 400 to 700° C. |
| gas pressure | 5 to 30 Torr |
| applied electric field | −100 to −350 V (AC) |
| electric field applying time | 10 to 90 min |

(c) Plasma Processing After Applying Electric Field

| | |
|---|---|
| reaction gas | $CH_4/H_2$ (7 to 15 vol %) $O_2$ (2.3 to 7.5 vol %) |
| flow rate of gas | 100 sccm |
| substrate temperature | 820° C. |
| gas pressure | 60 Torr |
| deposition time | 10 to 40 hr |

In the highly oriented diamond film that is obtained, the film thickness was in the range of about 10 to 60 μm, and 95% of the surface was covered with (100) crystal planes. The sectional micrographs, reveals that the differences in height between respective crystal planes is in the range of 0.3 μm or less. However, from the analysis for the sectional micrograph, it was confirmed that a silicon carbide film was formed between the substrate and the diamond film, whereas the silicon carbide film was epitaxially grown on the substrate and the diamond film was epitaxially grown on the silicon carbide film.

When the conditions during applying an electric field and the concentrations of methane and oxygen are out of the above-described ranges, the degree of orientation of crystals was reduced to be 10% or less. When the surface of the holder was not coated with diamond, even by performing the vapor-phase synthesis of diamond under the same conditions, the generation density of nuclei was lowered near the center of the substrate, and the degree of orientation was reduced to be 10% or less near the edge of the substrate. However, when a difference in height between the surface of the substrate and the surface of the holder was 10% or more of the distance between the emission center of plasma and the surface of the holder, the degree of orientation was significantly varied. Additionally, when the surface of the holder was not in the same level of the bottom surface of the microwave waveguide and the difference in height was 20% or more of the height of the waveguide, a polycrystalline non-oriented diamond film was formed.

EXAMPLE 2

Highly oriented diamond films were formed in the same manner as in Example 1 with an exception of a different source gas. In each step before, during and after applying an electric field, a reaction gas containing at least one kind of 0.1 to 0.5% of oxygen, 0.1% of chlorine, 0.1 to 1% of fluorine; or an inert gas containing at least one kind of 0.01 to 1% of helium, 0.01 to 0.1% of neon and 0.01 to 0.1% of argon was added in the vapor-phase in an amount of 1 vol % or less. As a result, it was confirmed that the degree of orientation of the highly oriented diamond film was increased by 10 to 50% at the same film thickness compared with Example 1 in which the gas was not used.

EXAMPLE 3

In this example, to examine the effect of the material of a holder on the formation of a highly oriented diamond film, experiments were made in the same manner as in Example 1. The characteristics of the diamond film thus obtained were evaluated in terms of the main peak half-value width of Raman spectrum, fluorescent background level, and graphite composition. As a result, when molybdenum, palladium, nickel, gold, platinum and copper were used as the material of the holder, the characteristics of the films were enhanced. On the contrary, when tantalum, tungsten, titanium, chromium and zirconium were used as the material of the holder, the characteristics of the film were reduced.

EXAMPLE 4

In this example, to examine the effect of the pre-treatment of a substrate on the formation of a highly oriented diamond film, experiments were made in the same manner as in Example 1. Prior to the process of carbonizing a substrate using carbon-containing plasma, the surface of the substrate was cleaned using hydrofluoric acid, and was left in a high vacuum of $10^{-6}$ Torr at a temperature of 800° C. or less for 15 min or more. As a result, it was confirmed that the degree of orientation of the highly oriented diamond film was increased by about 10% at the same film thickness compared with Example 1 in which the pre-treatment for the substrate was not performed. When the vacuum was decreased to be less than the above condition, or the processing time was 10 min or less, the degree of orientation of the highly oriented diamond film was not changed at the same film thickness compared with Example 1.

When a silicide such as nickel silicide, cobalt silicide, titanium silicide, tantalum silicide or tungsten silicide was epitaxially grown on a single crystal silicon substrate, the degree of orientation of a highly oriented diamond film was increased by about 30% at the same film thickness compared with Example 1.

EXAMPLE 5

Highly oriented diamond films were synthesized under the following conditions (a) and (b) using the system shown in FIG. 1 similarly to Example 1. A (111) single crystal nickel, cobalt or copper was used for the substrate. Platinum was used for the holder.

| (a) Plasma Processing During Applying Electric Field | |
|---|---|
| reaction gas | $CH_4/H_2$ (2 vol %) |
| flow rate of gas | 100 sccm |
| substrate temperature | 900° C. |
| gas pressure | 25 Torr |
| applied electric field | −200 V (AC) |
| electric field applying time | 20 min |
| (b) Plasma Processing After Applying Electric Field | |
| reaction gas | $CH_4/H_2$ (12 vol %) |
| | $O_2$ (5 vol %) |
| flow rate of gas | 100 sccm |
| substrate temperature | 900° C. |
| gas pressure | 30 Torr |
| deposition time | 20 hr |

Diamond particles were confirmed to be highly oriented diamond in which 95% of the surfaces of particles are (111) crystal planes. The analysis of the sectional micrograph, revealed that diamond particles were epitaxially grown on the substrate.

EXAMPLE 6

High oriented p-type semiconducting diamond films were synthesized under the following conditions (a) and (b) using the system shown in FIG. 1 similarly to Example 1. A (111) single crystal silicon was used for the substrate, and molybdenum was used for the holder.

| (a) Plasma Processing During Applying Electric Field | |
|---|---|
| reaction gas | $CH_4/H_2$ (3 vol %) |
| flow rate of gas | 100 sccm |
| substrate temperature | 700° C. |
| gas pressure | 25 Torr |
| applied electric field | 150 W |
| electric field applying time | 15 min |
| (b) Plasma Processing After Applying Electric Field | |
| reaction gas | $CH_4/H_2$ (10 Vol %) |
| | + $B_2H_6$ (10 ppm) |
| | $O_2$ (3 vol %) |
| flow rate of gas | 100 sccm |
| substrate temperature | 820° C. |
| gas pressure | 60 Torr |
| deposition time | 20 hr |

As a result, a p-type semiconducting highly oriented diamond film layer having a thickness of 20 μm where the surface was planarized and boundaries between the grains did not exist apparently, was obtained. The substrate was etched using a mixed solution of hydrofluoric acid and nitric acid, and the surface of the remaining highly oriented diamond film on the substrate side was processed using oxygen containing plasma for 30 sec. The hole mobility of this semiconducting diamond layer was measured to be 300 $cm^2/Vs$. The value was about twice as much as that prior to the etching of the substrate and the processing of the surface by oxygen-containing plasma (about 140 $cm^2/Vs$).

What is claimed is:

1. A method of forming a highly oriented diamond film comprising the steps of:

cleaning the surface of a single crystal substrate, and leaving it in a high vacuum of $10^{-6}$ Torr or less at a temperature between room temperature and 800° C. for 15 min for releasing gas molecules absorbed on the surface of said substrate processing the surface of said single crystal substrate using carbon-containing plasma applying an electric field between said substrate and the plasma for allowing a current to flow thereacross for a specified time, thereby forming nuclei of diamond for synthesizing a diamond film synthesizing highly oriented diamond particles or films in which crystal orientations are epitaxial to the said substrate.

2. A method of forming a highly oriented diamond film according to claim 1, wherein the carbon-containing plasma is added with a reaction gas containing at least one kind of gas selected from a group consisting of hydrogen, oxygen, chlorine and fluorine; or an inert gas containing at least one kind of gas selected from a group consisting of helium, neon and argon, in said process of processing the surface of said single crystal substrate using carbon-containing plasma.

3. A method of forming a highly oriented diamond film according to claim 1, wherein a carbon component is generated on the surface of said substrate in an amount more than that generated in a stable phase in a thermodynamic equilibrium, in said process of processing the surface of said single crystal substrate using carbon-containing plasma and in said process of applying an electric field across said substrate and plasma for a specified time for forming nuclei of diamond.

4. A method of forming a highly oriented diamond film according to claim 1, wherein a dc electric field is applied across said substrate and plasma to allow a dc current using a reaction gas containing hydrocarbon diluted with hydrogen, and at least one kind of gas selected from a group consisting of hydrogen, oxygen, chlorine and fluorine; or an inert gas containing at least one kind of gas selected from a group consisting of helium, neon and argon, in said process of forming nuclei of diamond.

5. A method of forming a highly oriented diamond film according to claim 1, wherein a dc voltage from −100 to −350 V is applied to said substrate for a period of time from 10 to 90 min at a substrate temperature between 400° to 1100° C. with a gas pressure from 1 to 30 Torr using hydrocarbon diluted with hydrogen in a volume ratio of 0.1 to 2%, in said process of forming nuclei of diamond.

6. A method of forming a highly oriented diamond film according to claim 1, wherein a gas used comprises a mixed gas of methane ($CH_4$) diluted with hydrogen and oxygen ($O_2$), in said step of synthesizing highly oriented diamond particles or films, wherein the concentration of the methane gas [$CH_4$] is specified to be 7% $\leq$[$CH_4$]$\leq$15%, and the concentration of the oxygen gas [$O_2$] is specified to be 2.3% $\leq$[$O_2$]$\leq$7.5%.

7. A method forming a highly oriented diamond film according to claim 1, wherein a gas used comprises an inert gas containing at least one kind of gas selected from a group consisting of methane, helium, neon and argon which are diluted with hydrogen; and a gas selected from halogen element-containing compounds consisting of carbon tetrachloride ($CCl_4$), chloroform ($CHCl_3$), dichloromethane ($CH_2Cl_2$), chloromethane ($CH_3Cl$) and methane tetrafluoride ($CF_4$), in said process of synthesizing highly oriented diamond particles or films.

8. A method of forming a highly oriented diamond film according to claim 1, wherein a gas containing boron (B) is added in a source gas, in said process of synthesizing highly oriented diamond particles or films.

9. A method of forming a highly oriented diamond film according to any of claims 1 to 8, wherein said substrate comprises a single crystal silicon substrate.

10. A method of forming a highly oriented diamond film according to claim 9, wherein a silicide selected from a group consisting of nickel silicide, cobalt silicide, titanium silicide, tantalum silicide and tungsten silicide on the surface of a said single crystal silicon substrate.

11. A method of forming a highly oriented diamond film according to claim 1, wherein said substrate comprises a single crystal or a film of a material containing at least one kind from a selected group consisting of nickel, cobalt and copper.

12. A method of forming a highly oriented diamond film according to claim 1, wherein a holder made of a material containing molybdenum supports said substrate so as to surround it.

13. A method of forming a highly oriented diamond film according to claim 12, wherein all or part of the surface of said holder is covered with diamond.

14. A method of forming a highly oriented diamond film according to claim 12, wherein a difference in height between the surface of said substrate and the surface of said holder is 10% or less of a distance between the emission center of plasma and the surface of said holder.

15. A method of forming a highly oriented diamond film according to claim 12, wherein the plasma processing is made using a quartz tube type microwave plasma CVD system in which a difference in height between the bottom surface of a microwave waveguide and the surface of said holder is 5% or less of the height of said waveguide.

16. A method of forming a highly oriented diamond film according to claim 1, wherein after said substrate on which the highly oriented diamond film is formed is removed, all or part of the polycrystalline diamond film formed at the interface between said substrate and said highly oriented diamond film is removed by plasma etching.

* * * * *